US006684298B1

(12) United States Patent
Dwarkadas et al.

(10) Patent No.: US 6,684,298 B1
(45) Date of Patent: Jan. 27, 2004

(54) DYNAMIC RECONFIGURABLE MEMORY HIERARCHY

(75) Inventors: Sandhya Dwarkadas, Rochester, NY (US); Rajeev Balasubramonian, Rochester, NY (US); Alper Buyuktosnoglu, Rochester, NY (US); David Albonesi, Lima, NY (US)

(73) Assignee: University of Rochester, Rochester, NY (US)

( * ) Notice: Subject to any disclaimer, the term of this patent is extended or adjusted under 35 U.S.C. 154(b) by 399 days.

(21) Appl. No.: 09/708,727

(22) Filed: Nov. 9, 2000

(51) Int. Cl.[7] .............................................. G06F 12/08
(52) U.S. Cl. ...................... 711/128; 711/117; 711/119; 711/126; 711/129; 711/206; 365/185.13; 365/230.03; 365/230.06
(58) Field of Search ................ 365/230.06, 230.03, 365/185.13; 711/117, 118, 119, 122, 126, 128, 129, 205, 206, 207, 212

(56) References Cited

U.S. PATENT DOCUMENTS

| 5,491,806 | A | * | 2/1996 | Horstmann et al. | ......... 711/207 |
|---|---|---|---|---|---|
| 5,774,471 | A | * | 6/1998 | Jiang | ........................... 714/711 |
| 5,910,927 | A | * | 6/1999 | Hamamoto et al. | .... 365/230.03 |
| 6,118,723 | A | * | 9/2000 | Agata et al. | ........... 365/230.03 |
| 6,349,363 | B2 | * | 2/2002 | Cai et al. | ..................... 711/129 |
| 6,442,078 | B1 | * | 8/2002 | Arimoto | ................ 365/189.08 |

OTHER PUBLICATIONS

Dynamic Memory Hierarchy Performance Optimization, R. Balasubramanian et al., International Symposium on Computer Architecture, Jul. 11, 2000.

* cited by examiner

Primary Examiner—Mano Padmanabhan
Assistant Examiner—Jasmine Song
(74) Attorney, Agent, or Firm—Blank Rome LLP

(57) ABSTRACT

A cache and TLB layout and design leverage repeater insertion to provide dynamic low-cost configurability trading off size and speed on a per application phase basis. A configuration management algorithm dynamically detects phase changes and reacts to an application's hit and miss intolerance in order to improve memory hierarchy performance while taking energy consumption into consideration.

12 Claims, 7 Drawing Sheets

FIG. 3

| Cache Configuration | L1 Size | L1 Assoc | L1 Acc Time | Subarray 2 W3 | Subarray 2 W2 | Subarray 2 W1 | Subarray 2 W0 | Subarray 0 W3 | Subarray 0 W2 | Subarray 0 W1 | Subarray 0 W0 | Subarray 1 W0 | Subarray 1 W1 | Subarray 1 W2 | Subarray 1 W3 | Subarray 3 W0 | Subarray 3 W1 | Subarray 3 W2 | Subarray 3 W3 |
|---|---|---|---|---|---|---|---|---|---|---|---|---|---|---|---|---|---|---|---|
| 256-1 | 256KB | 1 WAY | 2.0 | L2 | L2 | L2 | L2 | L2 | L2 | L2 | L1 | L1 | L2 | L2 | L2 | L2 | L2 | L2 | L2 |
| 512-2 | 512KB | 2 WAY | 2.5 | L2 | L2 | L2 | L2 | L2 | L2 | L1 | L1 | L1 | L1 | L2 | L2 | L2 | L2 | L2 | L2 |
| 768-3 | 768KB | 3 WAY | 2.5 | L2 | L2 | L2 | L2 | L2 | L1 | L1 | L1 | L1 | L1 | L1 | L2 | L2 | L2 | L2 | L2 |
| 1024-4 | 1024KB | 4 WAY | 3.0 | L2 | L2 | L2 | L2 | L1 | L1 | L1 | L1 | L1 | L1 | L1 | L1 | L2 | L2 | L2 | L2 |
| 512-1 | 512KB | 1 WAY | 3.0 | L2 | L2 | L2 | L2 | L2 | L2 | L2 | L1 | L1 | L2 | L2 | L2 | L2 | L2 | L2 | L1 |
| 1024-2 | 1024KB | 2 WAY | 3.5 | L2 | L2 | L2 | L1 | L2 | L2 | L1 | L1 | L1 | L1 | L2 | L2 | L2 | L2 | L1 | L1 |
| 1536-3 | 1536KB | 3 WAY | 4.0 | L2 | L1 | L1 | L1 | L2 | L1 | L1 | L1 | L1 | L1 | L1 | L2 | L1 | L1 | L1 | L2 |
| 2048-4 | 2048KB | 4 WAY | 4.5 | L1 | L1 | L1 | L1 | L1 | L1 | L1 | L1 | L1 | L1 | L1 | L1 | L1 | L1 | L1 | L1 |

DYNAMIC RECONFIGURABLE MEMORY HIERARCHY

FIELD OF THE INVENTION

The present invention is directed to the optimization of memory caches and TLB's (translation look-aside buffers) and more particularly to dynamic optimization of both speed and power consumption for each application.

DESCRIPTION OF RELATED ART

The performance of general purpose microprocessors continues to increase at a rapid pace. In the last 15 years, performance has improved at a rate of roughly 1.6 times per year with about half of that gain attributed to techniques for exploiting instruction-level parallelism and memory locality. Despite those advances, several impending bottlenecks threaten to slow the pace at which future performance improvements can be realized. Arguably the biggest potential bottlenecks for many applications in the future will be high memory latency and the lack of sufficient memory bandwidth. Although advances such as non-blocking caches and hardware and software-based prefetching can reduce latency in some cases, the underlying structure of the memory hierarchy upon which those approaches are implemented may ultimately limit their effectiveness. In addition, power dissipation levels have increased to the point where future designs may be fundamentally limited by that constraint in terms of the functionality that can be included in future microprocessors. Although several well-known organizational techniques can be used to reduce the power dissipation in on-chip memory structures, the sheer number of transistors dedicated to the on-chip memory hierarchy in future processors (for example, roughly 92% of the transistors on the Alpha 21364 are dedicated to caches) requires that those structures be effectively used so as not to needlessly waste chip power. Thus, new approaches that improve performance in a more energy-efficient manner than conventional memory hierarchies are needed to prevent the memory system from fundamentally limiting future performance gains or exceeding power constraints.

The most commonly implemented memory system organization is likely the familiar multi-level memory hierarchy. The rationale behind that approach, which is used primarily in caches but also in some TLBs (e.g., in the MIPS R10000), is that a combination of a small, low-latency L1 memory backed by a higher capacity, yet slower, L2 memory and finally by main memory provides the best tradeoff between optimizing hit time and miss time. Although that approach works well for many common desktop applications and benchmarks, programs whose working sets exceed the L1 capacity may expend considerable time and energy transferring data between the various levels of the hierarchy. If the miss tolerance of the application is lower than the effective L1 miss penalty, then performance may degrade significantly due to instructions waiting for operands to arrive. For such applications, a large, single-level cache (as used in the HP PA-8X00 series of microprocessors) may perform better and be more energy-efficient than a two-level hierarchy for the same total amount of memory. For similar reasons, the PA-8X00 series also implements a large, single-level TLB. Because the TLB and cache are accessed in parallel, a larger TLB can be implemented without impacting hit time in that case due to the large L1 caches that are implemented.

The fundamental issue in current approaches is that no one memory hierarchy organization is best suited for each application. Across a diverse application mix, there will inevitably be significant periods of execution during which performance degrades and energy is needlessly expended due to a mismatch between the memory system requirements of the application and the memory hierarchy implementation.

The inventors' previous approaches to that problem have exploited the partitioning of hardware resources to enable/disable parts of the cache under software control, but in a limited manner. The issues of how to practically implement such a design were not addressed in detail, the analysis only looked at changing configurations on an application-by-application basis (and not dynamically during the execution of a single application), and the simplifying assumption was made that the best configuration was known for each application. Furthermore, the organization and performance of the TLB were not addressed, and the reduction of the processor clock frequency with increases in cache size limited the performance improvement which could be realized.

Recently, Ranganathan, Adve, and Jouppi in "Reconfigurable caches and their application to media processing," *Proceedings of the 27th International Symposium on Computer Architecture*, pages 214–224, June, 2000, proposed a reconfigurable cache in which a portion of the cache could be used for another function, such as an instruction reuse buffer. Although the authors show that such an approach only modestly increases cache access time, fundamental changes to the cache may be required so that it may be used for other functionality as well, and long wire delays may be incurred in sourcing and sinking data from potentially several pipeline stages.

Furthermore, as more and more memory is integrated on-chip and increasing power dissipation threatens to limit future integration levels, the energy dissipation of the on-chip memory is as important as its performance. Thus, future memory-hierarchy designs must also be energy-aware by exploiting opportunities to trade off negligible performance degradation for significant reductions in power or energy. No satisfactory way of doing so is yet known in the art.

SUMMARY OF THE INVENTION

It will be readily apparent from the above that a need exists in the art to optimize the memory hierarchy organization for each application. It is therefore an object of the invention to reconfigure a cache dynamically for each application.

It is another object of the invention to improve both memory hierarchy performance and energy consumption.

To achieve the above and other objects, the present invention is directed to a cache in which a configuration management algorithm dynamically detects phase changes and reacts to an application's hit and miss intolerance in order to improve memory hierarchy performance while taking energy consumption into consideration.

The present invention provides a configurable cache and TLB orchestrated by a configuration algorithm that can be used to improve the performance and energy-efficiency of the memory hierarchy. A noteworthy feature of the present invention is the exploitation of the properties of conventional caches and future technology trends in order to provide cache and TLB configurability in a low-intrusive manner.

The present invention monitors cache and TLB usage and application latency tolerance at regular intervals by detecting phase changes using miss rates and branch frequencies, and thereby improves performance by properly balancing hit latency intolerance with miss latency intolerance dynamically during application execution (using CPI, or cycles per instruction, as the ultimate performance metric). Furthermore, instead of changing the clock rate, the present invention provides a cache and TLB with a variable latency so that changes in the organization of those structures only impact memory instruction latency and throughput. Finally, energy-aware modifications to the configuration algorithm are implemented that trade off a modest amount of performance for significant energy savings.

When applied to a two-level cache and TLB hierarchy at 0.1 μm technology, the result is an average 15% reduction in cycles per instruction (CPI), corresponding to an average 27% reduction in memory-CPI, across a broad class of applications compared to the best conventional two-level hierarchy of comparable size. Projecting to sub-0.1 μm technology design considerations which call for a three-level conventional cache hierarchy for performance reasons, a configurable L2/L3 cache hierarchy coupled with a conventional L1 results in an average 43% reduction in memory hierarchy energy in addition to improved performance.

The present invention significantly expands upon the inventors' previous results which addressed only performance in a limited manner for one technology point (0.1 μm) using a different (more hardware-intensive) configuration algorithm. The present invention provides a configurable hierarchy as a L1/L2 replacement in 0.1 μm technology, and as an L2/L3 replacement for a 0.035 μm feature size. For the former, the present invention provides an average 27% improvement in memory performance, which results in an average 15% improvement in overall performance as compared to a conventional memory hierarchy. Furthermore, the energy-aware enhancements bring memory energy dissipation in line with a conventional organization, while still improving memory performance by 13% relative to the conventional approach. For 0.035 μm geometries, where the prohibitively high latencies of large on-chip caches call for a three-level conventional hierarchy for performance reasons, a configurable L2/L3 cache hierarchy coupled with a conventional L1 reduces overall memory energy by 43% while even slightly increasing performance. That latter result demonstrates that because the configurable approach significantly improves memory hierarchy efficiency, it can serve as a partial solution to the significant power dissipation challenges facing future processor architects.

BRIEF DESCRIPTION OF THE DRAWINGS

A preferred embodiment of the present invention will be set forth in detail with reference to the drawings, in which:

FIG. 3 shows possible L1/L2 cache organizations which can be implemented in the cache data arrays of FIGS. 1 and 2;

DETAILED DESCRIPTION OF THE PREFERRED EMBODIMENT

A preferred embodiment of the present invention will now be set forth in detail with reference to the drawings.

The cache and TLB structures (both conventional and configurable) follow the structure described by G. McFarland, *CMOS Technology Scaling and Its Impact on Cache Delay*, Ph.D. thesis, Stanford University, June, 1997. McFarland developed a detailed timing model for both the cache and TLB which balances both performance and energy considerations in subarray partitioning, and which includes the effects of technology scaling.

Figure 1:
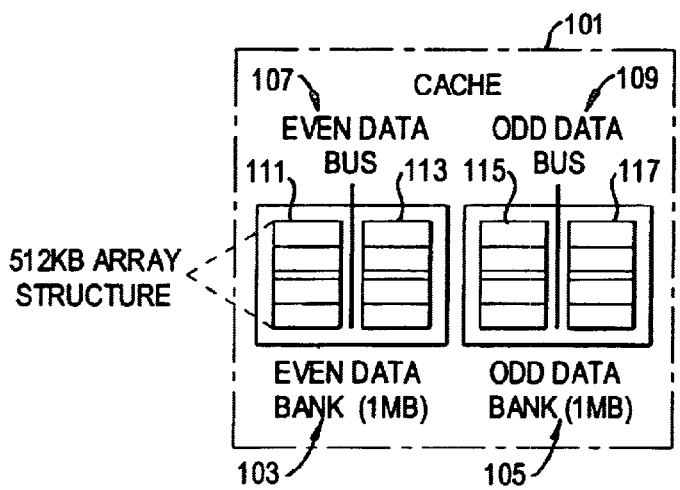
FIG. 1 shows an overall organization of the cache data arrays used in the preferred embodiment.

The preferred embodiment starts with a conventional 2 MB data cache 101 organized both for fast access time and for energy efficiency. As is shown in FIG. 1, the cache 101 is structured as two 1 MB interleaved banks 103, 105, each with a data bus 107 or 109. The banks 103, 105 are word-interleaved when used as an L1/L2 replacement and block-interleaved when used as an L2/L3 replacement. Such structuring is done in order to provide sufficient memory bandwidth for a four-way issue dynamic superscalar processor. In order to reduce access time and energy consumption, each 1 MB bank 103, 105 is further divided into two 512 KB SRAM structures or subarrays 111, 113, 115, 117, one of which is selected on each bank access. A number of modifications are made to that basic structure to provide configurability with little impact on access time, energy dissipation, and functional density.

Figure 2:
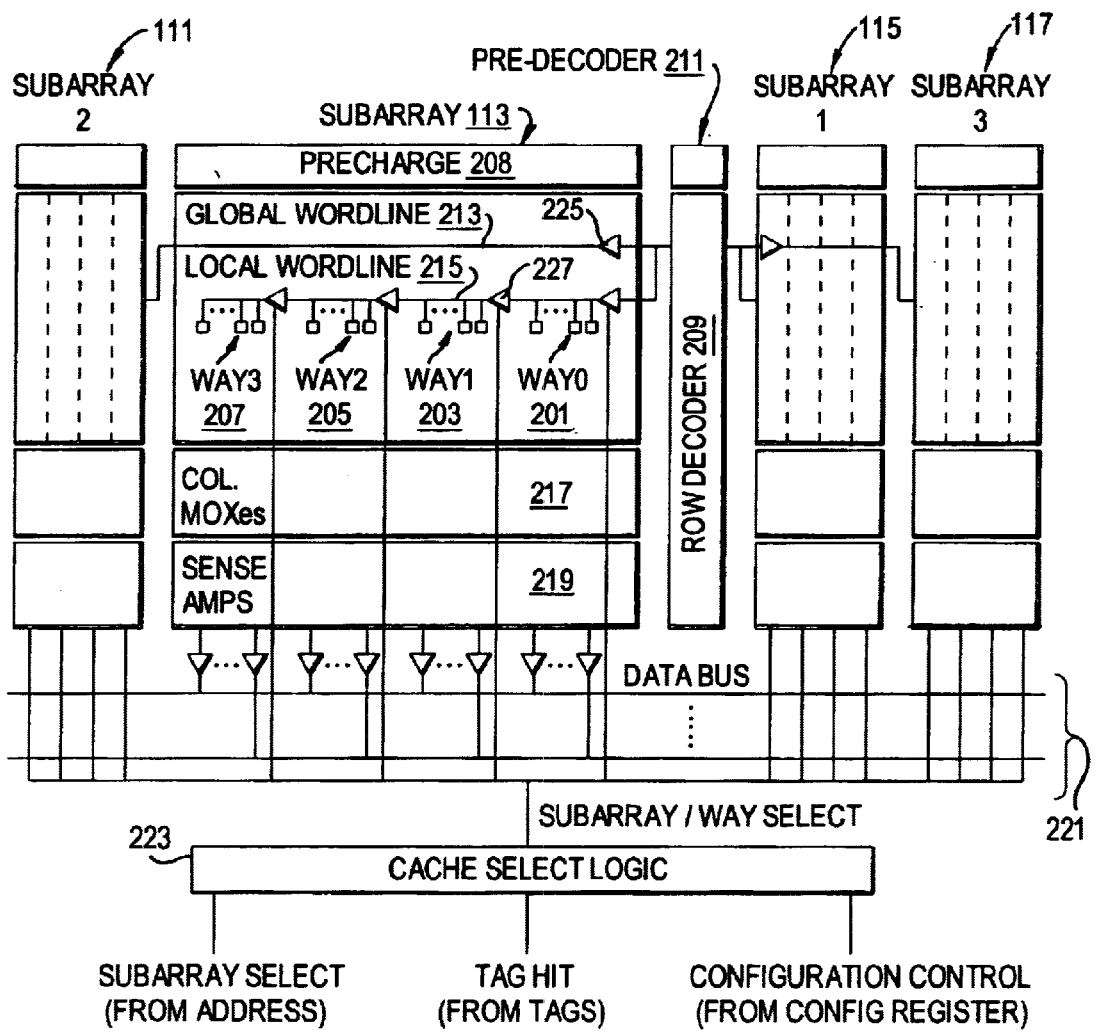
FIG. 2 shows the organization of one of the cache data arrays of FIG. 1.

The data array section of the configurable structure 101 is shown in FIG. 2 in which only the details of one subarray 113 are shown for simplicity. (The other subarrays 111, 115, 117 are identically organized). There are four subarrays 111, 113, 115, 117, each of which contains four ways 201, 203, 205, 207 and has a precharge 208. A row decoder 209 having a pre-decoder 211 is connected to each subarray 111, 113, 115, 117 by a global wordline 213 and to the ways 201, 203, 205, 207 in each subarray 111, 113, 115, 117 by a local wordline 215. Each subarray 111, 113, 115, 117 communicates via column MUXers 217 and sense amps 219 with a data bus 221. A cache select logic 223 controls subarray/way select in accordance with a subarray select from the address, a tag hit from tags and a configuration control from a configuration register. In both the conventional and configurable cache, two address bits (Subarray Select) are used to select only one of the four subarrays 111, 113, 115, 117 on each access in order to reduce energy dissipation. The other three subarrays have their local wordlines 215 disabled and their precharge 208, sense amp 219, and output driver circuits are not activated. The TLB virtual to real page number translation and tag check proceed in parallel and only the output drivers for the way in which the hit occurred are turned on. Parallel TLB and tag access can be accomplished if the operating system can ensure that index_bits-page_offset_bits bits of the virtual and physical addresses are identical, as is the case for the four-way set associative 1 MB dual-banked L1 data cache in the HP PA-8500.

In order to provide configurability while retaining fast access times, several modifications are made to McFarland's baseline design as shown in FIG. 2:

1. McFarland drives the global wordlines to the center of each subarray and then the local wordlines across half of the subarray in each direction in order to minimize the worst-case delay. In the configurable cache, because comparable delay with a conventional design for the smallest cache configurations is sought, the global wordlines 213 are distributed to the nearest end of each subarray 111, 113, 115, 117 and drive the local wordlines 215 across the entire subarray 111, 113, 115, 117.

2. McFarland organizes the data bits in each subarray by bit number. That is, data bit 0 from each way are grouped together, then data bit 1, etc. In the configurable cache, the bits are organized according to ways 201, 203, 205, 207 as shown in FIG. 2 in order to increase the number of configuration options.

3. Repeater switches 225 are used in the global wordlines 213 to electrically isolate each subarray. That is, subarrays 113 and 115 do not suffer additional global wordline delay due to the presence of subarrays 111 and 117. Providing switches as opposed to simple repeaters also prevents wordline switching in disabled subarrays thereby saving dynamic power.

4. Repeater switches 227 are also used in the local wordlines to electrically isolate each way 201, 203, 205, 207 in a subarray. The result is that the presence of additional ways does not impact the delay of the fastest ways. Dynamic power dissipation is also reduced by disabling the wordline drivers of disabled ways.

5. Configuration Control signals received from the Configuration Register through the cache select logic 223 provide the ability to disable entire subarrays 111, 113, 115, 117 or ways 201, 203, 205, 207 within an enabled subarray. Local wordline and data output drivers and precharge and sense amp circuits 208, 219 are not activated for a disabled subarray or way.

Using McFarland's area model, the additional area from adding repeater switches to electrically isolate wordlines is estimated to be 7%. In addition, due to the large capacity (and resulting long wordlines) of each cache structure, each local wordline is roughly 2.75 mm in length (due to the size of the cache) at 0.1 $\mu$m technology, and a faster propagation delay is achieved with those buffered wordlines compared with unbuffered lines. Moreover, because local wordline drivers are required in a conventional cache, the extra drivers required to isolate ways within a subarray do not impact the spacing of the wordlines, and thus bitline length is unaffected. In terms of energy, the addition of repeater switches increases the total memory hierarchy energy dissipation by 2–3% in comparison with a cache with no repeaters for the simulated benchmarks.

With the above modifications, the cache behaves as a virtual two-level, physical one-level, non-inclusive cache hierarchy, with the sizes, associativities, and latencies of the two levels dynamically chosen. In other words, a single large cache organization serves as a configurable two-level non-inclusive cache hierarchy, where the ways within each subarray which are initially enabled for an L1 access are varied to match application characteristics. The latency of the two sections is changed on half-cycle increments according to the timing of each configuration (and assuming a 1 GHz processor). Half cycle increments are required to provide the granularity to distinguish the different configurations in terms of their organization and speed. Such an approach can be implemented by capturing cache data using both phases of the clock, similar to the double-pumped Alpha 21264 data cache, and enabling the appropriate latch according to the configuration. The advantages of that approach are that the timing of the cache can change with its configuration while the main processor clock remains unaffected, and that no clock synchronization is necessary between the pipeline and cache.

However, because a constant two-stage cache pipeline is maintained regardless of the cache configuration, cache bandwidth degrades for the larger, slower configurations. Furthermore, the implementation of a cache whose latency can vary on half-cycle increments requires two pipeline modifications. First, the dynamic scheduling hardware must be able to speculatively issue (assuming a data cache hit) load-dependent instructions at different times depending on the currently enabled cache configuration. Second, for some configurations, running the cache on half-cycle increments requires an extra half-cycle for accesses to be caught by the processor clock phase. Some configurations may have a half cycle difference between the two pipeline stages that are assumed for each cache configuration.

When used as a replacement for a conventional L1/L2 on-chip cache hierarchy, the possible configurations are shown in FIG. 3. That figure shows the possible L1/L2 cache organizations which can be configured, as shown by the various allocations of the ways to L1 and L2. Only one of the four 512 KB SRAM structures is shown. Abbreviations for each organization are listed to the left of the size and associativity of the L1 section, while L1 access times in cycles are given on the right. Note that the TLB access may dominate the overall delay of some configurations. The numbers listed simply indicate the relative order of the access times for all configurations and thus the size/access time tradeoffs allowable.

Although multiple subarrays may be enabled as L1 in an organization, as in a conventional cache, only one is selected each access according to the Subarray Select field of the address. When a miss in the L1 section is detected, all tag subarrays and ways are read. That permits hit detection to data in the remaining portion of the cache (designated as L2 in FIG. 3). When such a hit occurs, the data in the L1 section (which has already been read out and placed into a buffer) is swapped with the data in the L2 section. In the case of a miss to both sections, the displaced block from the L1 section is placed into the L2 section. That prevents thrashing in the case of low-associative L1 organizations.

The direct-mapped 512 KB and two-way set associative 1 MB cache organizations are lower energy, and lower performance, alternatives to the 512 KB two-way and 1 MB four-way organizations, respectively. Those options activate half the number of ways on each access for the same capacity as their counterparts. For execution periods in which there are few cache conflicts and hit latency tolerance is high, the low energy alternatives may result in comparable performance yet potentially save considerable energy. Those configurations are used in an energy-aware mode of operation as described below.

Because some of the configurations span only two subarrays, while others span four, the number of sets is not always the same. Hence, it is possible that a given address might map into a certain cache line at one time and into another at another time (called a mis-map). In cases where subarrays two and three are disabled, the high-order Subarray Select signal is used as a tag bit. That extra tag bit is stored on all accesses in order to detect mis-maps and to handle the case in which data is loaded into subarray 0 or 1 during a period when subarrays 2 or 3 are disabled, but then maps into one of those latter two subarrays upon their being re-enabled. That case is detected in the same manner as data in a disabled way. If the data is found in a disabled subarray, it is transferred to the correctly mapped subarray. Simulation-based analysis indicates that such events occur infrequently for most applications. Mis-mapped data is handled the same way as a L1 miss and L2 hit, i.e., it results in a swap. Simulations indicate that such events are infrequent.

In sub-0.1 $\mu$m technologies, the long access latencies of a large on-chip L2 cache may be prohibitive for those applications which make use of only a small fraction of the L2 cache. Thus, for performance reasons, a three-level hierarchy with a moderate size (e.g., 512 KB) L2 cache will become an attractive alternative to two-level hierarchies at those feature sizes. However, the cost may be a significant increase in energy dissipation due to transfers involving the additional cache level. It will be demonstrated below that the use of the aforementioned configurable cache structure as a replacement for conventional L2 and L3 caches can significantly reduce energy dissipation without any compromise in performance as feature sizes scale below 0.1 $\mu$m.

Figure 4:
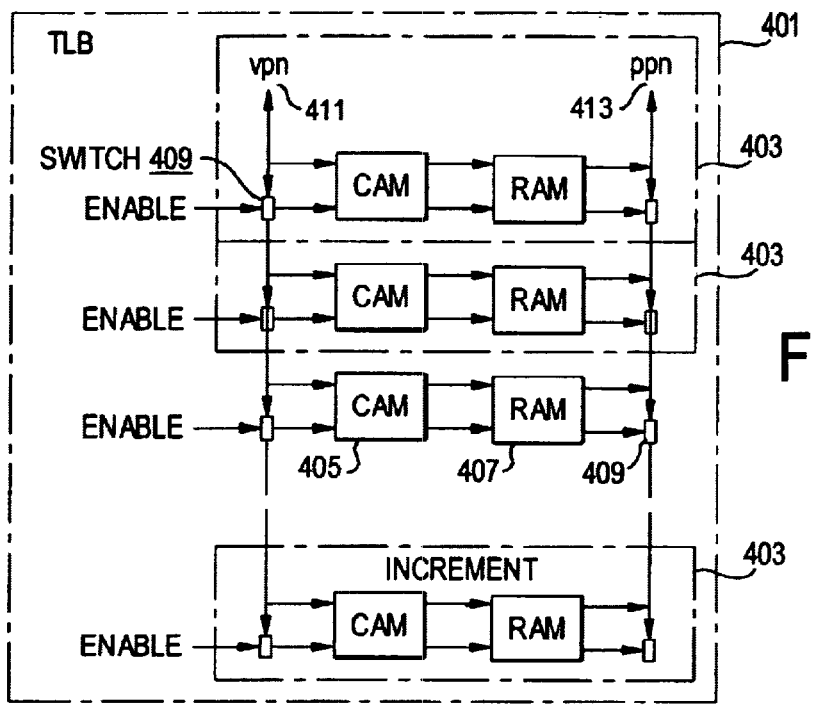
FIG. 4 shows the organization of a configurable translation look-aside buffer according to the preferred embodiment.

A 512-entry, fully-associative TLB 401 can be similarly configured, as shown in FIG. 4. There are eight TLB increments 403, each of which contains a CAM 405 of 64 virtual page numbers and an associated RAM 407 of 64 physical page numbers. Switches 409 are inserted on the input and output buses 411, 413 to electrically isolate successive increments. Thus, the ability to configure a larger TLB does not degrade the access time of the minimal size (64 entry) TLB. Similar to the cache design, TLB misses result in a second access but to the backup portion of the TLB.

The configurable cache and TLB layout makes it possible to turn off selected repeaters, thus enabling only a fraction of the cache and TLB at any time. For the L1/L2 reconfiguration, that fraction represents an L1 cache, while the rest of the cache serves as a non-inclusive L2 which is looked up in the event of an L1 miss. Thus, L1 hit time is traded off with L1 miss time to improve performance. That structure can also take the place of an L2–L3 hierarchy. Trading off hit and miss time also reduces the number of cache-to-cache transfers, thus reducing the cache hierarchy energy dissipation.

Dynamic selection mechanisms will now be disclosed. First, the selection mechanisms for the configurable cache and TLB when used as a replacement for a conventional L1/L2 on-chip hierarchy will be disclosed. Then, the mechanisms as applied to a configurable L2/L3 cache hierarchy coupled with a conventional fixed-organization L1 cache will be disclosed.

The configurable cache and TLB approach makes it possible to pick appropriate configurations and sizes based on application requirements. The different configurations spend different amounts of time and energy accessing the L1 and the lower levels of the memory hierarchy. Heuristics improve the efficiency of the memory hierarchy by trying to minimize idle time due to memory hierarchy access. The goal is to determine the right balance between hit latency and miss rate for each application phase based on the tolerance of the phase for the hit and miss latencies. The selection mechanisms are designed to improve performance, and modifications are introduced to the heuristics which opportunistically trade off a small amount of performance for significant energy savings. Those heuristics require appropriate metrics for assessing the cache/TLB performance of a given configuration during each application phase.

Cache miss rates give a first order approximation of the cache requirements of an application, but they do not directly reflect the effects of various cache sizes on memory stall cycles. Here, a metric is first presented which quantifies that effect, and the manner in which it can be used to dynamically pick an appropriate cache configuration is described. The actual number of memory stall cycles is a function of the time taken to satisfy each cache access and the ability of the out-of-order execution window to overlap other useful work while those accesses are made. In the prior art, load latency tolerance has been characterized, and two hardware mechanisms have been introduced for estimating the criticality of a load. One of those monitors the issue rate while a load is outstanding and the other keeps track of the number of instructions dependent on that load. While those schemes are easy to implement, they are not very accurate in capturing the number of stall cycles resulting from an outstanding load. The preferred embodiment more accurately characterizes load stall time and further breaks that down as stalls due to cache hits and misses. The goal is to provide insight to the selection algorithm as to whether it is necessary to move to a larger or smaller L1 cache configuration (or not to move at all) for each application phase.

A simple mechanism will be described with reference to the flow chart of FIG. 1. The initial scheme or state, set in step 1101, is tuned to improve performance and thus explores the following five cache configurations: direct-mapped 256 KB L1, 768 KB 3-way L1, 1 MB 4-way L1, 1.5 MB 3-way L1, and 2 MB 4-way L1. The 512 KB 2-way L1 configuration provides no performance advantage over the 768 KB 3-way L1 configuration (due to their identical access times in cycles) and thus that configuration is not used. For similar reasons, the two low-energy configurations (direct-mapped 512 KB L1 and two-way set associative 1 MB L1) are only used with modifications to the heuristics which reduce energy (described shortly).

At the end of each interval of execution (step 1103; 100K cycles in the simulations), a set of hardware counters is examined in step 1105. Those hardware counters provide the miss rate, the IPC, and the branch frequency experienced by the application in that last interval. Based on that information, the selection mechanism (which could be implemented in software or hardware) picks one of two states in step 1107—stable or unstable. The former suggests that behavior in that interval is not very different from the last and that it is not necessary to change the cache configuration, while the latter suggests that there has recently been a phase change in the program and that an appropriate size needs to be picked.

The initial state set in step 1101 is unstable, and the initial L1 cache is chosen to be the smallest (256 KB in the preferred embodiment). At the end of an interval, the CPI experienced for that cache size is entered into a table in step 1109. If the miss rate exceeds a certain threshold (1% in the preferred embodiment) during that interval, as determined in step 1111, and the maximum L1 size is not reached, as determined in step 1113, the next larger L1 cache configuration is adopted for the next interval of operation in step 1115 in an attempt to contain the working set. That exploration continues until the maximum L1 size is reached or until the miss rate is sufficiently small. At that point, in step 1117, the table is examined, the cache configuration with the lowest CPI is picked, the table is cleared, and the stable state is switched to. The cache remains in the stable state while the number of misses and branches does not significantly differ from that in the previous interval, as determined in step 1119. When there is a change, then in step 1121, the unstable state is switched to, the smallest L1 cache configuration is returned to, and the exploration starts again. The above is repeated in step 1123 for the next interval. The pseudo-code for the mechanism is listed below.

```
if(state==STABLE)
    if((num_miss-last num_miss)<m_noise
        && (num_br-last_num_br)<br_noise)
        decr m_noise, br_noise;
    else
        cache_size=SMALLEST;
        state=UNSTABLE;
if (state==UNSTABLE)
    record CPI;
    if ((miss_rate>THRESHOLD)
        && (cache_size!=MAX)
        cache_size++;
    else
        cache_size=that with best CPI;
        state=STABLE;
        if (cache_size==prev_cache_size)
            incr br_noise, m_noise;
```

Different applications see different variations in the number of misses and branches as they move across application phases. Hence, instead of using a single fixed number as the threshold to detect phase changes, the threshold is changed dynamically. If an exploration phase results in picking the same cache size as before, the noise threshold is increased to discourage such needless explorations. Likewise, every interval spent in the stable state causes a slight decrement in the noise threshold in case it had been set to too high a value.

The miss rate threshold ensures that larger cache sizes are explored only if required. Note that a high miss rate need not necessarily have a large impact on performance because of the ability of dynamic superscalar processors to hide L2 latencies. That could result in a few needless explorations.

The intolerance metrics only serve as a guide to help limit the search space. Exploration is expensive and should preferably not be pursued unless there is a possible benefit. Clearly, such an interval-based mechanism is best suited to programs which can sustain uniform behavior for a number of intervals. While switching to an unstable state, step 1121 also moves to the smallest L1 cache configuration as a form of "damage control" for programs having irregular behavior. That choice ensures that for those programs, more time is spent at the smaller cache sizes and hence performance is similar to that using a conventional cache hierarchy. In addition, the mechanism keeps track of how many intervals are spent in stable and unstable states. If it turns out that too much time is spent exploring, the program behavior is not suited to an interval-based scheme, and the smallest sized cache is retained.

Earlier experiments used a novel hardware design to estimate the hit and miss latency intolerance of an application's phase (which the selection mechanism just set forth attempts to minimize). Those estimates were then used to detect phase changes as well as to guide exploration. As current results show in comparison to those of the inventors' previous experiments, the additional complexity of the hardware is not essential to obtaining good performance. Presently, it is envisioned that the selection mechanism would be implemented in software, although, as noted above, it could be implemented in hardware instead. Every 100K cycles, a low-overhead software handler will be invoked which examines the hardware counters and updates the state as necessary. That imposes minimal hardware overhead as the state can be stored in memory and allows flexibility in terms of modifying the selection mechanism. The code size of the handler is estimated to be only 120 static assembly instructions, only a fraction of which are executed during each invocation, resulting in a net overhead of less than 0.1%. In terms of hardware overhead, roughly 9 20-bit counters are needed for the number of misses, loads, cycles, instructions, and branches, in addition to a state register. That amounts to fewer than 8,000 transistors, and most processors already come equipped with some such performance counters.

One such early experiment will now be described. To every entry in the register map table, one bit is added which indicates whether the given (logical) register is to be written by a load instruction. In addition, for every entry in the Register Update Unit (RUU), which is a unified queue and re-order buffer structure which holds all instructions which have dispatched and not committed, one bit is added per operand which specifies whether the operand is produced by a load (which can be deduced from the additional register map table bits) and another specifying whether the load was a hit (the initial value upon insertion into the RUU) or a miss. Every cycle, that information is used to determine how many instructions were stalled by an outstanding load. Each cycle, every instruction in the RUU which directly depends on a load increments one of two global intolerance counters if (i) all operands except for the operand produced by a load are ready, (ii) a functional unit is available, and (iii) there are free issue slots in that cycle. For every cycle in which those conditions are met up to the point that the load-dependent instruction issues, the hit intolerance counter is incremented unless a cache miss is detected for the load which on it is dependent; if such a miss occurs, the hit/miss bit is switched and the miss intolerance counter is incremented each cycle that the above three conditions are met until the point at which the instruction issues. If more than one operand of an instruction is produced by a load, a heuristic is used to choose the hit/miss bit of one of the operands. Simulations have been performed which choose the operand corresponding to the load which issued first. That scheme requires only very minor changes to existing processor structures and two additional performance counters, and yet it provides a very accurate assessment of the relative impact of the hit time and the miss time of the current cache configuration on actual execution time of a given program phase.

The metric just described has limitations in the presence of multiple stalled instructions due to loads. Free issue slots may be mis-categorized as hit or miss intolerance if the resulting dependence chains were to converge. That miscategorization of lack of ILP manifests itself when the converging dependence chains are of different lengths. Multiple dependence chains go on to converge, and each chain could have a different length. The program is usually limited by the longer chain, i.e., stalling the shorter chain for a period of time should not affect the execution time. Hence, the number of program stall cycles should be dependent on the stall cycles for the longer dependence chain. The chain on the critical path is difficult to compute at runtime. The miss and hit intolerance metrics effectively add the stalls for both chains and in practice work well. For TLB characterization, the preferred embodiment implements a simple TLB miss handler cycle counter due to the fact that in the model used, the pipeline stalls while a TLB miss is serviced (assuming that TLB miss handling is done in software). TLB usage is also tracked by counting the number of TLB entries accessed during a specified period.

Large L1 caches have a high hit rate, but also have higher access times. To arrive at the cache configuration which is the optimal trade-off point between the cache hit and miss times, the preferred embodiment uses a simple mechanism which uses past history to pick a size for the future, based on CPI as the performance metric.

The cache hit and miss intolerance counters indicate the effect of a given cache organization on actual execution time. Large caches tend to have higher hit intolerance because of the greater access time, but lower miss intolerance due to the smaller miss rate. Those intolerance counters serve as a hint to indicate which cache configurations to explore and as a rule of thumb, the best configuration is often the one with the smallest sum of hit and miss intolerance. To arrive at that configuration dynamically at runtime, a simple mechanism is used which uses past history to pick a size for the future.

Figure 12:
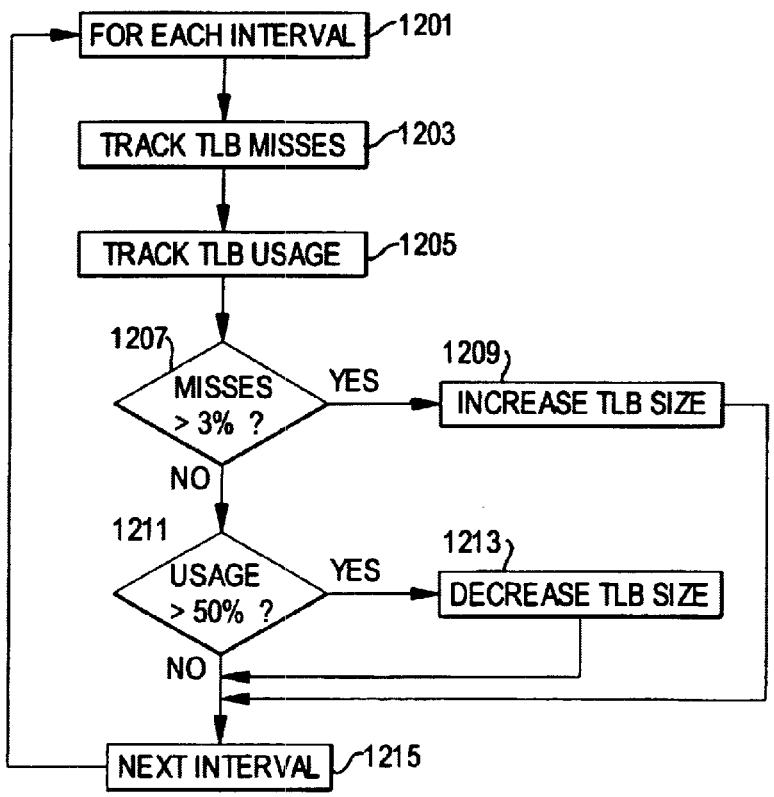
FIG. 12 shows a flow chart of operations performed in reconfiguring a translation look-aside buffer.

In addition to cache reconfiguration, the TLB configuration is also progressively changed as shown in the flow chart of FIG. 12. The change is performed on an interval-by-interval basis. as indicated by steps 1201 and 1215. A counter tracks TLB miss handler cycles in step 1203. In step 1205, a single bit is added to each TLB entry which is set to indicate whether it has been used in an interval (and is cleared at start of an interval). If the counter exceeds a threshold (which is contemplated to be 3%, although those skilled in the art will be able to select the threshold needed) of the total execution time counter for an interval, as determined in step 1207, the L 1 TLB cache size is increased in step 1209. In step 1211, it is determined whether the TLB usage is less than half. If so, the L1 TLB cache size is decreased in step 1213.

For the cache reconfiguration, an interval size of 100K cycles was chosen so as to react quickly to changes without letting the selection mechanism pose a high cycle overhead. For the TLB reconfiguration, a larger one million cycle interval was used so that an accurate estimate of TLB usage could be obtained. A smaller interval size could result in a spuriously high TLB miss rate over some intervals, and/or low TLB usage. For both the cache and the TLB, the interval sizes are illustrative rather than limiting, and other interval sizes can be used instead.

A miss in the first-level cache causes a lookup in the backup ways (the second level of the exclusive cache). Applications whose working set does not fit in the 2 MB of on-chip cache will often not find data in the L2 section. Such applications might be better off bypassing the L2 section lookup altogether. Previous work has investigated bypassing in the context of cache data placement, i.e., they selectively choose not to place data in certain levels of cache. In contrast, the preferred embodiment bypasses the lookup to a particular cache level. Once the dynamic selection mechanism has reached the stable state, the L2 hit rate counter is checked. If that is below a particular threshold, the L2 lookup is bypassed for the next interval. If that results in a CPI improvement, bypassing continues. Bypassing a level of cache would mean paying the cost of flushing all dirty lines first. That penalty can be alleviated in a number of ways—(i) do the writebacks in the background when the bus is free, and until that happens, access the backup and memory simultaneously; (ii) attempt bypassing only after context switches, so that fewer writebacks need to be done.

As previously mentioned, the interval-based scheme will work well only if the program can sustain its execution phase for a number of intervals. That limitation may be overcome by collecting statistics and making subsequent configuration changes on a per-subroutine basis. The finite state machine used for the interval-based scheme is now employed for each subroutine. That requires maintaining a table with CPI values at different cache sizes and the next size to be picked for a limited number of subroutines (100 in the present embodiment). To focus on the most important routines, only those subroutines are monitored whose invocations exceed a certain threshold of instructions (1000 in the present embodiment). When a subroutine is invoked, its table is looked up, and a change in cache configuration is effected depending on the table entry for that subroutine. When a subroutine exits, it updates the table based on the statistics collected during that invocation. A stack is used to checkpoint counters on every subroutine call so that statistics can be determined for each subroutine invocation.

Two subroutine-based schemes were investigated. In the non-nested approach, statistics are collected for a subroutine and its callees. Cache size decisions for a subroutine are based on those statistics collected for the call-graph rooted at that subroutine. Once the cache configuration is changed for a subroutine, none of its callees can change the configuration unless the outer subroutine returns. Thus, the callees inherit the size of their callers because their statistics played a role in determining the configuration of the caller. In the nested scheme, each subroutine collects statistics only for the period when it is the top of the subroutine call stack. Thus, every single subroutine invocation is looked upon as a possible change in phase. Those schemes work well only if successive invocations of a particular subroutine are consistent in their behavior. A common case where that is not true is that of a recursive program. That situation is handled by not letting a subroutine update the table if there is an outer invocation of the same subroutine, i.e., it is assumed that only the outermost invocation is representative of the subroutine and that successive outermost invocations will be consistent in their behavior.

If the stack used to checkpoint statistics overflows, it is assumed that future invocations will inherit the size of their caller for the non-nested case, and the minimum sized cache will be used for the nested case. While the stack is in a state of overflow, subroutines will be unable to update the table. If a table entry is not found while entering a subroutine, the default smallest sized cache is used for that subroutine for the nested case.

Because the simpler non-nested approach generally outperformed the nested scheme, results will be reported below only for the former.

Energy-aware modifications will now be disclosed. There are two energy-aware modifications to the selection mechanisms. The first takes advantage of the inherently low-energy configurations (those with direct-mapped 512 KB and two-way set associative 1 MB L1 caches). With that approach, the selection mechanism simply uses those configurations in place of the 768 KB 3-way L1 and IMB 4-way L1 configurations.

A second potential approach is to serially access the tag and data arrays of the L1 data cache. Conventional L1 caches always perform parallel tag and data lookup to reduce hit time, thereby reading data out of multiple cache ways and ultimately discarding data from all but one way. By performing tag and data lookup in series, only the data way associated with the matching tag can be accessed, thereby reducing energy consumption. Hence, the second low-energy mode operates just like the interval-based scheme as before, but accesses the set-associative cache configurations by serially reading the tag and data arrays.

L1 caches are inherently more energy-hungry than L2 caches because they do parallel tag and data access, as a result of which, they lookup more cache ways than actually required. Increasing the size of the L1 as described thus far would result in an increase in energy consumption in the caches. The natural question is—does it make sense to attempt reconfiguration of the L2 so that CPI improvement can be got without the accompanying energy penalty?

Hence, the present cache design can be used as an exclusive L2–L3, in which case the size of the L2 is dynamically changed. The selection mechanism for the L2/L3 reconfiguration is very similar to the simple interval-based mechanism for the L1/L2 described above. In addition, because it is assumed that the L2 and L3 caches (both conventional and configurable) already use serial tag/data access to reduce energy dissipation, the energy-aware modifications would provide no additional benefit for L2/L3 reconfiguration. (Recall that performing the tag lookup first makes it possible to turn on only the required data way within a subarray, as a result of which, all configurations consume the same amount of energy for the data array access.) Finally, the TLB reconfiguration was not simultaneously examined so as not to vary the access time of the fixed L1 data cache. Much of the motivation for those simplifications was due to the expectation that dynamic L2/L3 cache configuration would yield mostly energy saving benefits, due to the fact that the L1 cache configuration was not being altered (the organization of which has the largest memory performance impact for most applications). To further improve energy savings at minimal performance penalty, the search mechanism was also modified to pick a larger sized cache if it performed almost as well (within 95% in our simulations) as the best performing cache during the exploration, thus reducing the number of transfers between the L2 and L3.

In summary, the dynamic mechanisms just set forth estimate the needs of the application and accordingly pick an appropriate cache and TLB configuration. Hit and miss intolerance metrics were introduced which quantify the effect of various cache sizes on the program's execution time. Those metrics provide guidance in the exploration of various cache sizes, making sure that a larger size is not tried unless miss intolerance is sufficiently high. The interval-based method collects those statistics every 100K cycles and based on recent history, picks a size for the future. The subroutine-based method does that for every subroutine invocation. To reduce energy dissipation, the selection mechanism is kept as it is, but the cache configurations available to it are changed, i.e., the energy efficient low-associativity caches or caches that do serial tag and data lookup are used. The same selection mechanism is also applied to the L2/L3 reconfiguration. The above techniques will now be evaluated.

Simplescalar-3.0 was used for the Alpha AXP instruction set to simulate an aggressive 4-way superscalar out-of-order processor. The architectural parameters used in the simulation are summarized in Table 1:

| | |
|---|---|
| Fetch queue entries | 8 |
| Branch predictor | combination of bimodal and two-level share; bimodal/share level 1/2 entries - 2048, 1024 (hist. 10), 4096 (global); respectively; combining pred. entries - 1024; RAS entries - 32; BTB - 2048 sets, 2-way |
| Branch misprediction latency | 8 cycles |
| Fetch, decode, issue width | 4 |
| RUU and LSQ entries | 64 and 32 |
| L1 I-cache | 2-way; 64 kB (0.1 $\mu$m), 32 kB (0.035 $\mu$m) |
| Memory latency | 80 cycles (0.1 $\mu$m), 114 cycles (0.035 $\mu$m) |
| Integer ALUs/mult-div | 4/2 |
| FP ALUs/mult-div | 2/1 |

The data memory hierarchy is modeled in great detail. For the reconfigurable cache, the 2 MB of on-chip cache is partitioned as a two-level exclusive cache, where the size of the L1 is dynamically picked. It is organized as two word-interleaved banks, each of which can service up to one cache request every cycle. It is assumed that the access is pipelined, so a fresh request can issue after half the time it takes to complete one access. For example, contention for all caches and buses in the memory hierarchy as well as for writeback buffers is modeled. The line size of 128 bytes was chosen because it yielded a much lower miss rate for our benchmark set than smaller line sizes.

As shown in FIG. 3, the minimum cache is 256 KB and direct mapped, while the largest is 2 MB 4-way, the access times being 2 and 4.5 cycles, respectively. The minimum sized TLB has 64 entries, while the largest is 512. For both configurable and conventional TLB hierarchies, a TLB miss at the first level results in a lookup in the second level. A miss in the second level results in a call to a TLB handler that is assumed to complete in 30 cycles. The page size is 8 KB.

The configurable TLB is not like an inclusive 2-level TLB in that the second level is never written to. It is looked up in the hope of finding an entry left over from a previous configuration with a larger level one TLB. Hence it is much simpler than the conventional two-level TLB of the same size.

A variety of benchmarks from SPEC95, SPEC2000, and the Olden suite have been used. Those particular programs were chosen because they have high miss rates for the L1 caches considered. For programs with low miss rates for the smallest cache size, the dynamic scheme affords no advantage and behaves like a conventional cache. The benchmarks were compiled with the Compaq cc, f77, and f90 compilers at an optimization level of O3. Warmup times were determined for each benchmark, and the simulation was fast-forwarded through those phases. The window size was chosen to be large enough to accommodate at least one outermost iteration of the program, where applicable. A further million instructions were simulated in detail to prime all structures before starting the performance measurements. Table 2 below summarizes the benchmarks and their memory reference properties (the L1 miss rate and load frequency).

| Benchmark | Suite | Datasets | Simulation window (instrs) | 64K-2 way L1 miss rate | % of instrs that are loads |
| --- | --- | --- | --- | --- | --- |
| em3d | Olden | 20,000 nodes, arity 20 | 1000M–1100M | 20% | 36% |
| health | Olden | 4 levels, 1000 iters | 80M–140M | 16% | 54% |
| mst | Olden | 256 nodes | entire program 14M | 8% | 18% |
| compress | SPEC95 INT | ref | 1900M–2100M | 13% | 22% |
| hydro2d | SPEC95 FP | ref | 2000M–2135M | 4% | 28% |
| apsi | SPEC95 FP | ref | 2200M–2400M | 6% | 23% |
| swim | SPEC2000 FP | ref | 2500M–2782M | 10% | 25% |
| art | SPEC2000 FP | ref | 300M–1300M | 16% | 32% |

With regard to timing and energy estimation, the inventors investigated two future technology feature sizes: 0.1 and 0.035 $\mu$m. For the 0.035 $\mu$m design point, cache latency values were used whose model parameters are based on projections from the Semiconductor Industry Association Technology Roadmap. For the 0.1 $\mu$m design point, the cache and TLB timing model developed by McFarland are used to estimate timings for both the configurable cache and TLB, and the caches and TLBs of a conventional L1/L2 hierarchy. McFarland's model contains several optimizations, including the automatic sizing of gates according to loading characteristics, and the careful consideration of the effects of technology scaling down to 0.1 $\mu$m technology. The model integrates a fully-associative TLB with the cache to account for cases in which the TLB dominates the L1 cache access path. That occurs, for example, for all of the conventional caches that were modeled as well as for the minimum size L1 cache (direct mapped 256 KB ) in the configurable organization.

For the global wordline, local wordline, and output driver select wires, cache and TLB wire delays are recalculated using RC delay equations for repeater insertion. Repeaters are used in the configurable cache as well as in the conventional L1 cache whenever they reduce wire propagation delay. The energy dissipation of those repeaters was accounted for as well, and they add only 2–3% to the total cache energy.

Cache and TLB energy dissipation were estimated using a modified version of the analytical model of Kamble and Ghose. That model calculates cache energy dissipation using similar technology and layout parameters as those used by the timing model (including voltages and all electrical parameters appropriately scaled for 0.1 $\mu$m technology). The TLB energy model was derived from that model and included CAM match line precharging and discharging, CAM wordline and bitline energy dissipation, as well as the energy of the RAM portion of the TLB. For main memory, only the energy dissipated due to driving the off-chip capacitive busses was included.

For all L2 and L3 caches (both configurable and conventional), the inventors assume serial tag and data access and selection of only one of 16 data banks at each access, similar to the energy-saving approach used in the Alpha 21164 on-chip L2 cache. In addition, the conventional L1 caches were divided into two subarrays, only one of which is selected at each access. That is identical to the smallest 64 KB section accessed in one of the four configurable cache structures with the exception that the configurable cache reads its full tags at each access (to detect data in disabled subarrays/ways). Thus, the conventional cache hierarchy against which the reconfigurable hierarchy was compared was highly optimized for both fast access time and low energy dissipation.

Detailed event counts were captured during SimpleScalar simulations of each benchmark. Those event counts include all of the operations that occur for the configurable cache as well as all TLB events, and are used to obtain final energy estimations.

TABLE 3 below shows the conventional and dynamic L1/L2 schemes simulated:

A    Base excl. cache with 256 KB 1-way L1 & 1.75 MB 14-way L2
B    Base incl. cache with 256 KB 1-way L1 & 2 MB 16-way L2
C    Base incl. cache with 64 KB 2-way L1 & 2 MB 16-way L2
D    Interval-based dynamic scheme
E    Subroutine-based with nested changes
F    Interval-based with energy-aware cache configurations
G    Interval-based with serial tag and data access The dynamic schemes of the preferred embodiment will be compared with three conventional configurations which are identical in all respects, except the data cache hierarchy. The first uses a two-level non-inclusive cache, with a direct mapped 256 KB L1 cache backed by a 14-way 1.75 MB L2 cache (configuration A). The L2 associativity results from the fact that 14 ways remain in each 512 KB structure after two of the ways are allocated to the 256 KB L1 (only one of which is selected on each access). Comparison of that scheme with the configurable approach demonstrates the advantage of resizing the first level. The inventors also compare the preferred embodiment with a two-level inclusive cache which consists of a 256 KB direct mapped L1 backed by a 16-way 2 MB L2 (configuration B). That configuration serves to measure the impact of the non-inclusive policy of the first base case on performance (a non-inclusive cache performs worse because every miss results in a swap or writeback, which causes greater bus and memory port contention.) Another comparison is with a 64 KB 2-way inclusive L1 and 2 MB of 16-way L2 (configuration C), which represents a typical configuration in a modem processor and ensures that the performance gains for the dynamically sized cache are not obtained simply by moving from a direct mapped to a set associative cache. For both the conventional and configurable L2 caches, the access time is 15 cycles due to serial tag and data access and bus transfer time, but is pipelined with a new request beginning every four cycles. The conventional TLB is a two-level inclusive TLB with 64 entries in the first level and 448 entries in the second level with a 6 cycle lookup time.

For L2/L3 reconfiguration, the interval-based configurable cache is compared with a conventional three-level on-chip hierarchy. In both, the L1 cache is 32 KB two-way set associative with a three cycle latency, reflecting the smaller L1 caches and increased latency likely required at 0.035 $\mu$m geometries. For the conventional hierarchy, the L2 cache is 512 two-way set associative with a 21 cycle latency and the L3 cache is 2 MB 16-way set associative with a 60 cycle latency. Serial tag and data access is used for both L2 and L3 caches to reduce energy dissipation.

The inventors will first evaluate the performance and energy dissipation of the L1/L2 configurable schemes versus the three conventional approaches using delay and energy values for 0.1 μm geometries. It will then be demonstrated how L2/L3 reconfiguration can be used at finer 0.035 μm geometries to dramatically improve energy efficiency relative to a conventional three-level hierarchy but with no compromise of performance.

Figure 5:
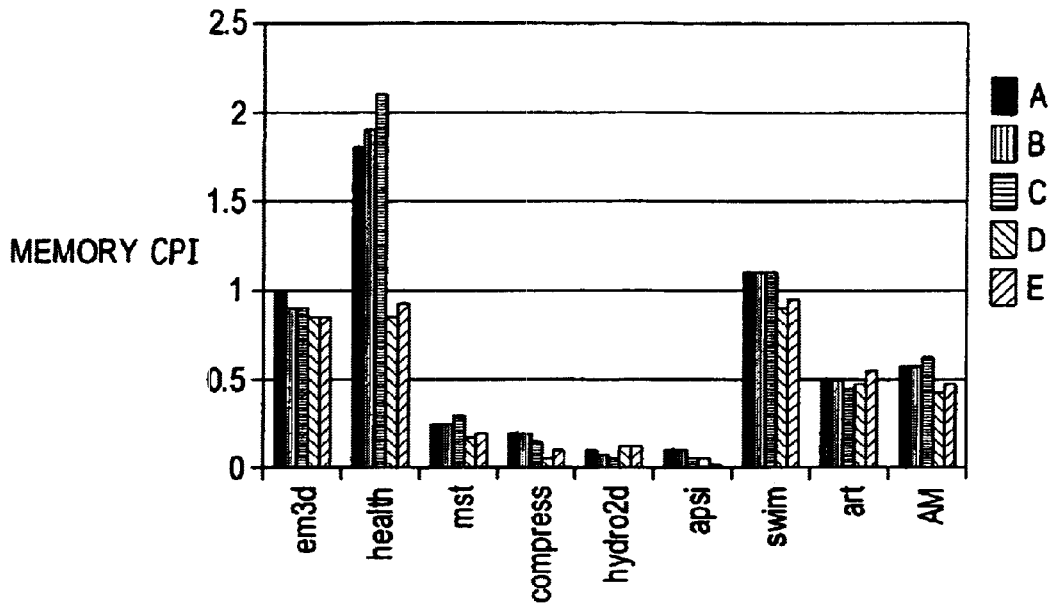
FIG. 5 shows memory CPI for conventional, interval-based and subroutine-based configurable schemes.
Figure 6:
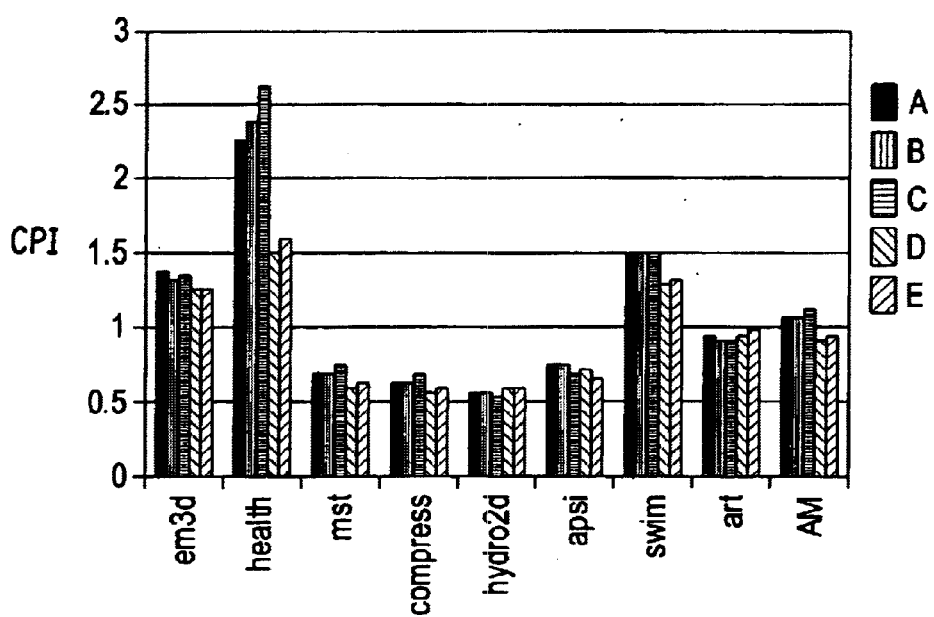
FIG. 6 shows total CPI for conventional, interval-based and subroutine-based configurable schemes.

FIGS. 5 and 6 show the memory CPI and total CPI, respectively, achieved by the conventional and configurable interval and subroutine based schemes for the various benchmarks. The memory CPI is calculated by subtracting the CPI achieved with a simulated system with a perfect cache (all hits and one cycle latency) from the CPI with the memory hierarchy. In comparing the arithmetic mean (AM) of the memory CPI performance, the interval-based configurable scheme outperforms the best-performing conventional scheme (B) (measured in terms of a percentage reduction in memory CPI) by 27%, with roughly equal cache and TLB contributions as is shown in Table 4 below:

|  | Cache contribution | TLB contribution | Cache explorations | TLB changes |
| --- | --- | --- | --- | --- |
| em3d | 73% | 27% | 10 | 2 |
| health | 33% | 67% | 27 | 2 |
| mst | 100% | 0% | 5 | 3 |
| compress | 64% | 36% | 54 | 2 |
| hydro2d | 100% | 0% | 19 | 0 |
| apsi | 100% | 0% | 63 | 27 |
| swim | 49% | 51% | 5 | 6 |
| art | 100% | 0% | 11 | 5 |

For each application, that table also presents the number of cache and TLB explorations that resulted in the selection of different sizes. In terms of overall performance, the interval-based scheme achieves a 15% reduction in CPI. The benchmarks with the biggest memory CPI reductions are health (52%), compress (50%), apsi (31%), and mst (30%).

The dramatic improvements with health and compress are due to the fact that particular phases of those applications perform best with a large L1 cache even with the resulting higher hit latencies (for which there is reasonably high tolerance within those applications). For health, the configurable scheme settles at the 1.5 MB cache size for most of the simulated execution period, while the 768 KB configuration is chosen for much of compress's execution period. Note that TLB reconfiguration also plays a major role in the performance improvements achieved. Those two programs best illustrate the mismatch that often occurs between the memory hierarchy requirements of particular application phases and the organization of a conventional memory hierarchy, and how an intelligently-managed configurable hierarchy can better match on-chip cache and TLB resources to those execution phases. Note that while some applications stay with a single cache and TLB configuration for most of their execution window, others demonstrate the need to adapt to the requirements of different phases in each program (see Table 4). Regardless, the dynamic schemes are able to determine the best cache and TLB configurations, which span the entire range of possibilities, for each application during execution. Note also, that even though the inventors did not run the applications to completion, 3–4 application phases in which a different configuration was chosen were typically encountered during the execution of each of the eight programs.

The results for art and hydro2d demonstrate how the dynamic reconfiguration may in some cases degrade performance. Those applications are very unstable in their behavior and do not remain in any one phase for more than a few intervals. Art also does not fit in 2 MB, so there is no size which causes a sufficiently large drop in CPI to merit the cost of exploration. However, the dynamic scheme identifies that the application is spending more time exploring than in stable state and turns exploration off altogether. Because that happens early enough in case of art (the simulation window is also much larger), art shows no overall performance degradation, while hydro2d has a slight 3% slowdown. That result illustrates that compiler analysis to identify such "unstable" applications and override the dynamic selection mechanism with a statically-chosen cache configuration may be beneficial.

Comparing the interval and subroutine-based schemes shows that the simpler interval-based scheme usually outperforms the subroutine-based approach. The most notable exception is apsi, which has inconsistent behavior across intervals (as indicated by the large number of explorations in Table 4), causing it to thrash between a 256 KB L1 and a 768 KB L1. The subroutine-based scheme significantly improves performance relative to the interval-based approach as each subroutine invocation within apsi exhibits consistent behavior from invocation to invocation. Yet, due to the overall results and the additional complexity of the subroutine-based scheme, the interval-based scheme appears to be the most practical choice and is the only scheme considered in the rest of the analysis.

In terms of the effect of TLB reconfiguration, health, swim, and compress benefit the most from using a larger TLB. Health and compress perform best with 256 and 128 entries, respectively, and the dynamic scheme settles at those sizes. Swim shows phase change behavior with respect to TLB usage, resulting in five stable phases requiring either 256 or 512 TLB entries. A slight degradation in performance results from the configurable TLB in some of the benchmarks, because of the fact that the configurable TLB design is effectively a one-level hierarchy using a smaller number of total TLB entries since data is not swapped between the primary and backup portions when handling TLB misses.

Those results demonstrate potential performance improvement for one technology point and microarchitecture. In order to determine the sensitivity of our qualitative results to different technology points and microarchitectural trade-offs, the processor pipeline speed was varied relative to the memory latencies (keeping the memory hierarchy latency fixed). The results in terms of performance improvement were similar for 1 (the base case), 1.5, and 2 GHz processors.

Figure 7:
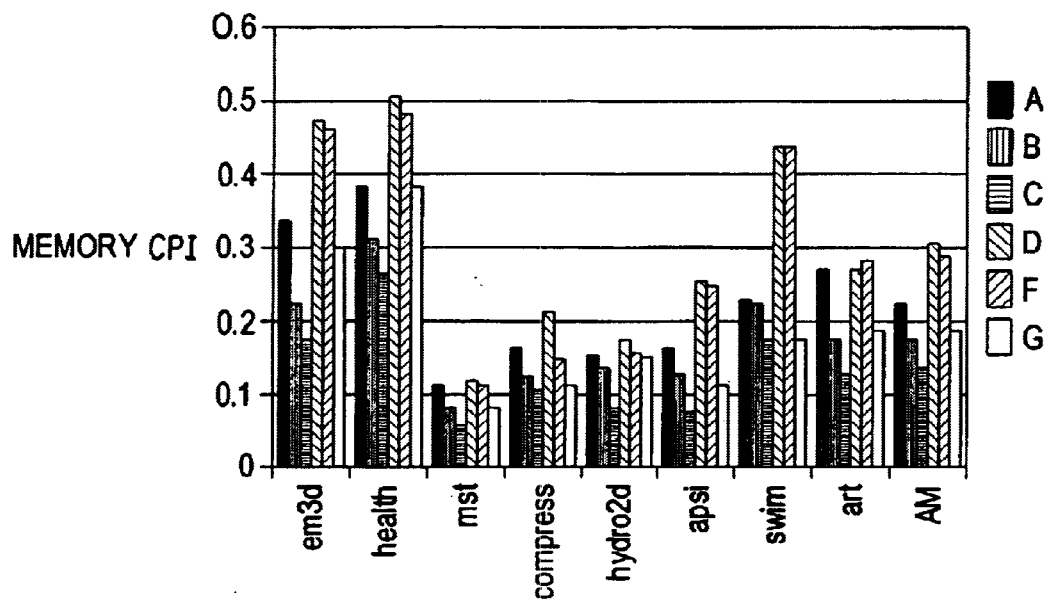
FIG. 7 shows memory EPI in nanojoules for conventional, interval-based and energy-aware configurable schemes.

Energy-aware configuration results will now be set forth. The focus will be on the energy consumption of the on-chip memory hierarchy (including that to drive the off-chip bus). The memory energy per instruction (memory EPI, with each energy unit measured in nanojoules) results of FIG. 7 illustrate how as is usually the case with performance optimizations, the cost of the performance improvement due to the configurable scheme is a significant increase in energy dissipation. That is caused by the fact that energy consumption is proportional to the associativity of the cache and our configurable L1 uses larger set-associative caches. For that reason, the inventors explore how the energy-aware improvements may be used to provide a more modest performance improvement yet with a significant reduction in memory EPI relative to a pure performance approach.

Figure 8:
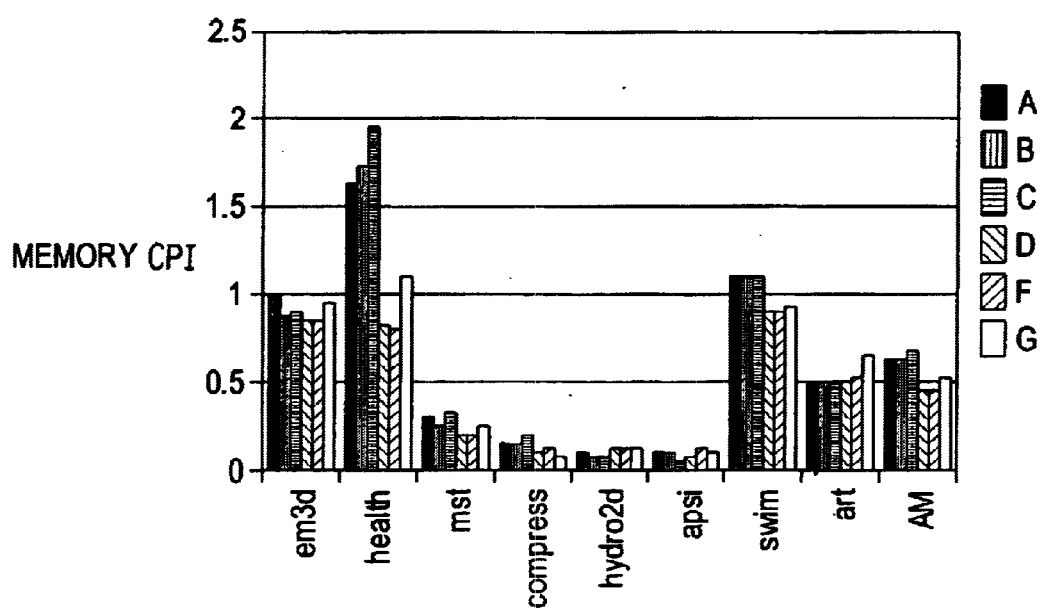
FIG. 8 shows memory CPI for conventional, interval-based and energy-aware configurable schemes.

FIG. 7 shows that merely selecting the energy-aware cache configurations (scheme F) has only a nominal impact on energy. In contrast, operating the L1 cache in a serial tag and data access mode (G) reduces memory EPI by 38% relative to the baseline interval-based scheme (D), bringing it in line with the best overall-performing conventional approach (B). For compress and swim, that approach even achieves roughly the same energy, with significantly better performance (see FIG. 8) than conventional configuration C, whose 64 KB two-way L1 data cache activates half the amount of cache every cycle than the smallest L1 configuration (256 KB) of the configurable schemes. In addition, because the selection scheme automatically adjusts for the higher hit latency of serial access, that energy-aware configurable approach reduces memory CPI by 13% relative to the best-performing conventional scheme (B). Thus, the energy-aware approach may be used to provide more modest performance improvements in portable applications where design constraints such as battery life are of utmost importance. Furthermore, as with the dynamic voltage and frequency scaling approaches used today, that mode may be switched on under particular environmental conditions (e.g., when remaining battery life drops below a given threshold), thereby providing on-demand energy-efficent operation.

To reduce energy, mechanisms such as serial tag and data access (as described above) have to be used. Since L2 and L3 caches are often already designed for serial tag and data access to save energy, reconfiguration at those lower levels of the hierarchy would not increase the energy consumed. Instead, they stand to decrease it by reducing the number of data transfers that need to be done between the various levels, i.e., by improving the efficiency of the memory hierarchy.

Thus, the energy benefits are investigated for providing a configurable L2/L3 cache hierarchy with a fixed L1 cache as on-chip cache delays significantly increase with sub-0.1 $\mu$m geometries. Due to the prohibitively long latencies of large caches at those geometries, a three-level cache hierarchy becomes an attractive design option from a performance perspective.

The inventors use the parameters from Agarwal et al, "Clock rate versus IPC: The end of the road for conventional microarchitectures," *Proceedings of the 27th International Symposium on Computer Architecture*, pages 282–292, June, 2000, for 0.035 $\mu$m technology to illustrate how dynamic L2/L3 cache configuration can match the performance of a conventional three-level hierarchy while dramatically reducing energy dissipation.

Figure 9:
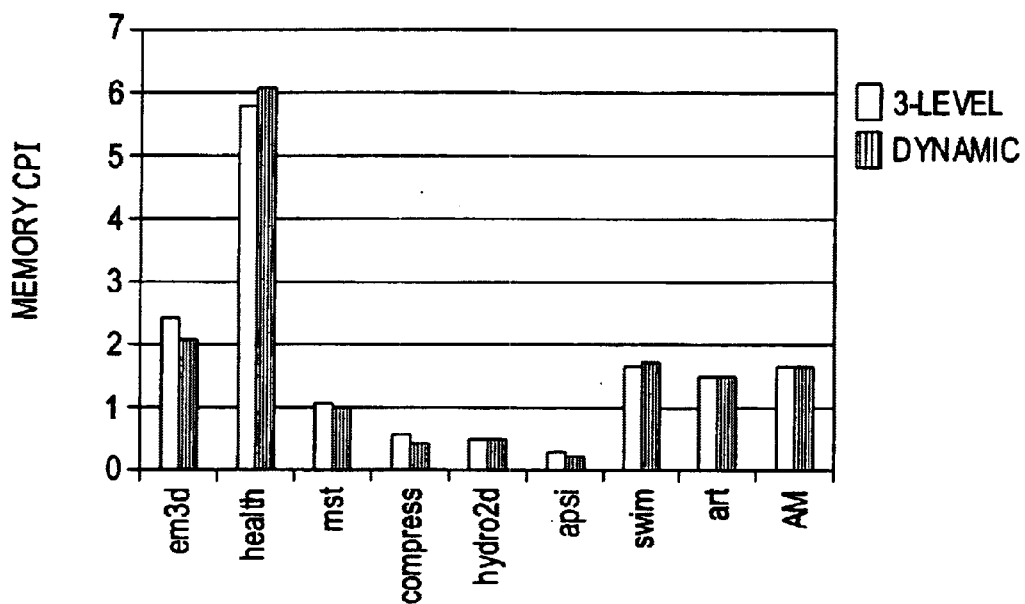
FIG. 9 shows memory CPI for conventional three-level and dynamic cache hierarchies.
Figure 10:
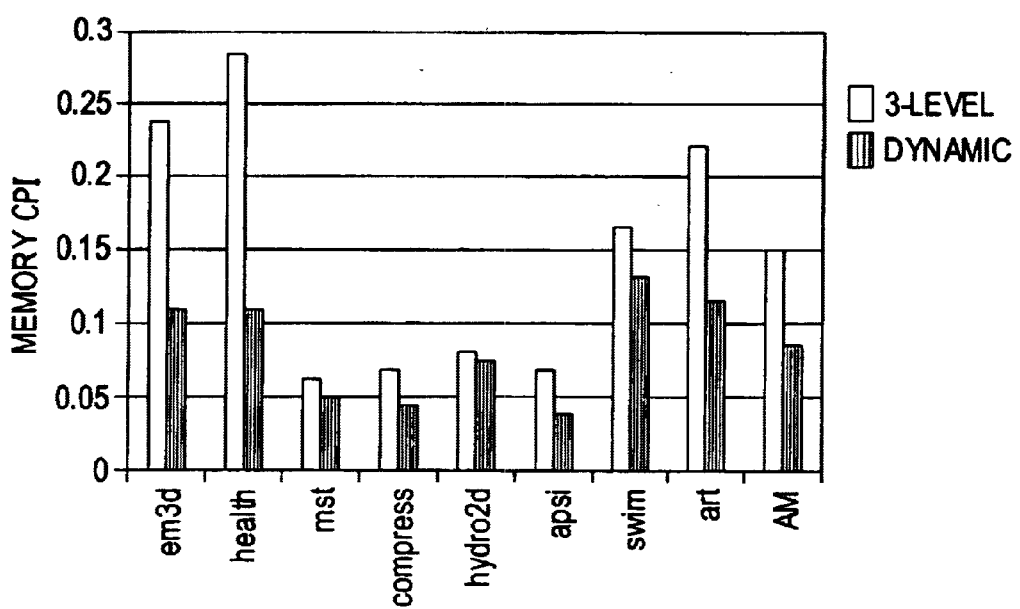
FIG. 10 shows memory EPI in nanojoules for conventional three-level and dynamic cache hierarchies.
Figure 11:
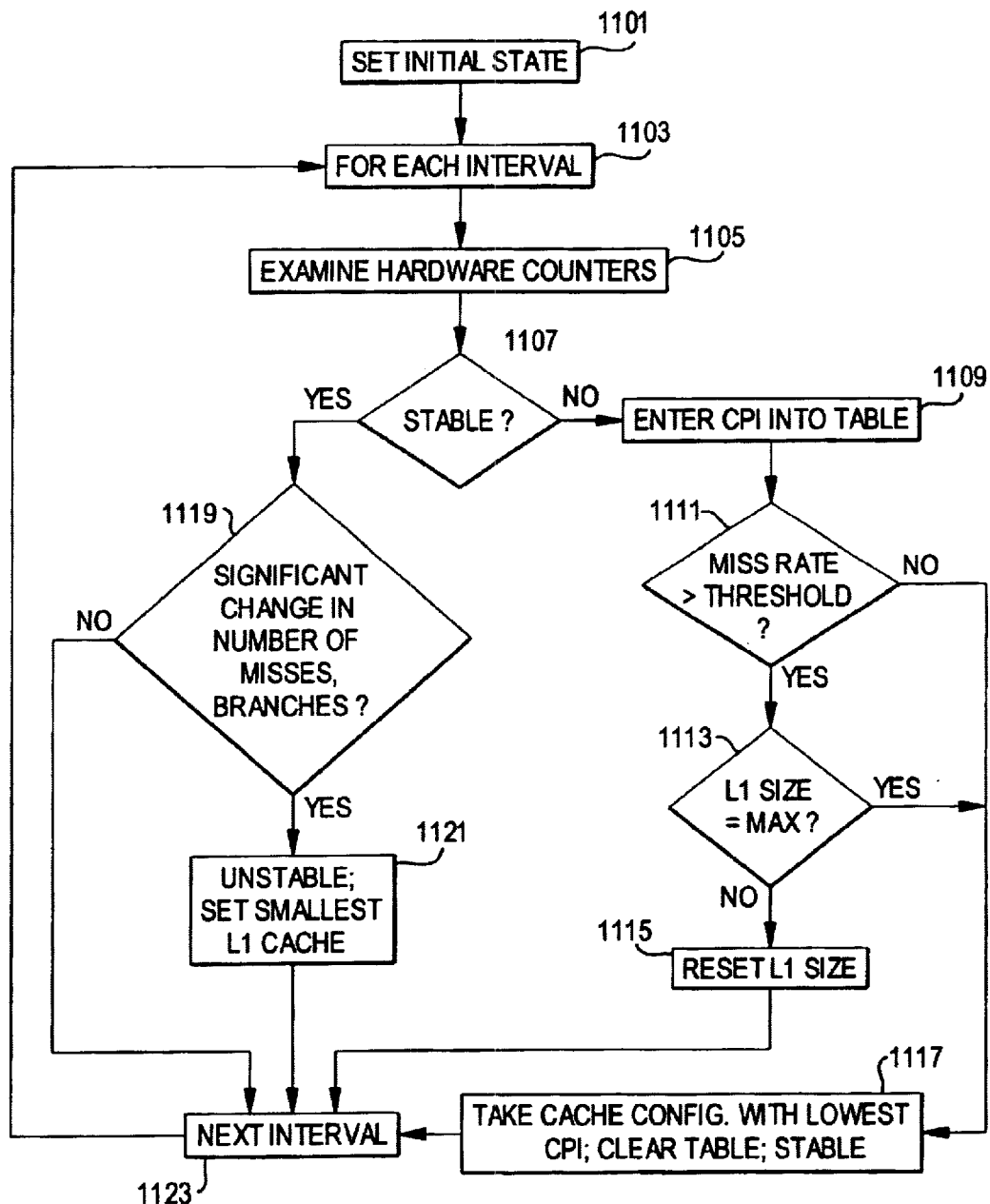
FIG. 11 shows a flow chart of operations performed in reconfiguring a cache.

FIGS. 9 and 10 compare the performance and energy, respectively, of the conventional three-level cache hierarchy with the configurable scheme. Recall that TLB configuration was not attempted so the improvements are completely attributable to the cache. Since the L1 cache organization has the largest impact on cache hierarchy performance, as expected, there is little performance difference between the two, as each uses an identical conventional L1 cache. However, the ability of the dynamic scheme to adapt the L2/L3 configuration to the application results in a 43% reduction in memory EPI on average. The savings are caused by the ability of the dynamic scheme to use a larger L2, and thereby reduce the number of transfers between L2 and L3. Having only a two-level cache would, of course, eliminate those transfers altogether, but would be detrimental to program performance because of the large 60-cycle L2 access. Thus, in contrast to that approach of simply opting for a lower energy, and lower performing, solution (the two-level hierarchy), dynamic L2/L3 cache configuration can improve performance while dramatically improving energy efficiency.

The benchmarks were run with a perfect memory system (all data cache accesses serviced in 1 cycle) to estimate the contribution of the memory system to execution time. The difference in CPIs is referred to as the memory-CPI. Since the dynamic cache is only trying to improve memory performance, the memory-CPI quantifies the impact on memory performance, while CPI quantifies the impact on overall performance. While comparing energy consumption of the various configurations, the inventors use mem-EPI (memory energy per instruction). To get an idea of overall performance across all benchmarks, the inventors use 2 metrics—the geometric mean (GM) of CPI speedups and the harmonic mean (HM) of IPCs and the corresponding values for the memory-CPI. Likewise, the inventors use the GM of EPI speedups (energy of base case/energy of configuration) and the HM of instruction per joule.

The preferred embodiment thus provides a novel configurable cache and TLB as an alternative to conventional cache hierarchies. Repeater insertion is leveraged to enable dynamic cache and TLB configuration, with an organization that allows for dynamic speed/size tradeoffs while limiting the impact of speed changes to within the memory hierarchy. The configuration management algorithm is able to dynamically examine the tradeoff between an application's hit and miss intolerance using CPI as the ultimate metric to determine appropriate cache size and speed. At 0.1 $\mu$m technologies, our results show an average 15% reduction in CPI in comparison with the best conventional L1–L2 design of comparable total size, with the benefit almost equally attributable on average to the configurable cache and TLB. Furthermore, energy-aware enhancements to the algorithm trade off a more modest performance improvement for a significant reduction in energy. Projecting to 0.035$\mu$m technologies and a 3-level cache hierarchy, improved performance can be shown with an average 43% reduction in memory hierarchy energy when compared to a conventional design. That latter result demonstrates that because the configurable approach significantly improves memory hierarchy efficiency, it can serve as a partial solution to the significant power dissipation challenges facing future processor architects.

While a preferred embodiment of the present invention and various modifications thereof have been set forth in detail, those skilled in the art will readily appreciate that other embodiments can be realized within the scope of the invention. For example, recitations of specific hardware or software should be construed as illustrative rather than limiting. The same is true of specific interval times, thresholds, and the like. Therefore, the present invention should be construed as limited only by the appended claims.

We claim:

1. A data cache for caching data in a computing device, the data cache operating at a plurality of levels in a memory hierarchy, the data cache comprising:
    a plurality of subarrays for storing the data, each of the plurality of subarrays being divided into a plurality of individually addressable ways, each of the plurality of ways being individually configurable to operate at one of the plurality of levels in the memory hierarchy;
    a decoder for addressing the data in the subarrays;
    a global wordline connecting the decoder to each of the plurality of subarrays; and
    a local wordline connecting the global wordline to each of the of plurality of ways in each of the plurality of subarrays.

2. The data cache of claim 1, wherein:
    each of the plurality of subarrays has an end closest to the decoder; and in each of the plurality of subarrays, the local wordline branches from the global wordline at the end closest to the decoder.

3. The data cache of claim 1, wherein the global wordline comprises a first plurality of repeater switches to isolate the plurality of subarrays from one another.

4. The data cache of claim 3, wherein, in each of the plurality of subarrays, the local wordline comprises a second plurality of repeater switches to isolate the plurality of ways from one another.

5. The data cache of claim 1, further comprising means for selectively disabling the plurality of subarrays.

6. The data cache of claim 5, further comprising means for selectively disabling the plurality of ways in each of the plurality of subarrays.

7. The data cache of claim 1, wherein the plurality of levels comprise L1 and L2.

8. The data cache of claim 1, wherein the plurality of levels comprise L2 and L3.

9. The data cache of claim 8, further comprising an L1 cache of fixed size.

10. A translation look-aside buffer for use in a computing device, the translation look-aside buffer comprising:

a plurality of increments, each for storing virtual page numbers and associated physical page numbers, each of the plurality of increments having an input and an output;

an input bus connected to the inputs of the plurality of increments;

an output bus connected to the outputs of the plurality of increments; and switches in the input and output buses to disconnect the plurality of increments selectively from the input and output buses to vary a size of the translation look-aside buffer.

11. The translation look-aside buffer of claim 10, wherein the plurality of increments are connected in parallel to the input and output buses.

12. The translation look-aside buffer of claim 10, wherein each of the plurality of increments comprises:

a first memory for storing the virtual page numbers, the first memory having an input and an output; and a second memory for storing the physical page numbers, the second memory having an input and an output;

and wherein:

the output of the first memory is connected to the input of the second memory;

the input of the first memory is the input of the increment; and the output of the second memory is the output of the increment.

\* \* \* \* \*

UNITED STATES PATENT AND TRADEMARK OFFICE
CERTIFICATE OF CORRECTION

PATENT NO. : 6,684,298 B1
DATED : January 27, 2004
INVENTOR(S) : Sandhya Dwarkadas et al.

It is certified that error appears in the above-identified patent and that said Letters Patent is hereby corrected as shown below:

Column 1,
Immediately after the title, please insert the following:
-- This invention was made under a contract with United States Government under Grant Nos. DARP/ITO F29601-00-K-0182; NSF EIA-9972881; NSF CDA-01142; NSF CCR-9811929; NSF CCR-9702466; and NSF CCR-9701915.
The government has certain rights in this invention. --

Signed and Sealed this

First Day of June, 2004

JON W. DUDAS
*Acting Director of the United States Patent and Trademark Office*